(12) United States Patent
Bremicker et al.

(10) Patent No.: US 7,817,406 B2
(45) Date of Patent: Oct. 19, 2010

(54) INVERTER COMPRISING A CASING

(75) Inventors: Sven Bremicker, Alheim (DE); Andreas Donth, Edermünde (DE); Ralf Andrae, Calden (DE); Johannes Häde, Alheim (DE); Yasar Nafiz, Paderborn (DE); Matthias Victor, Niestetal (DE)

(73) Assignee: SMA Solar Technologie AG, Niestetal (DE)

( * ) Notice: Subject to any disclaimer, the term of this patent is extended or adjusted under 35 U.S.C. 154(b) by 78 days.

(21) Appl. No.: 12/151,490

(22) Filed: May 7, 2008

(65) Prior Publication Data

US 2008/0304220 A1 Dec. 11, 2008

(30) Foreign Application Priority Data

Jun. 8, 2007 (EP) .................................. 07011248

(51) Int. Cl.
*H05K 7/16* (2006.01)
(52) U.S. Cl. ............................ 361/679.01; 361/679.02; 361/679.27; 361/679.21; 248/917
(58) Field of Classification Search ............ 361/679.01, 361/679.21, 679.27; 248/917–924
See application file for complete search history.

(56) References Cited

U.S. PATENT DOCUMENTS

| 5,388,032 | A | * | 2/1995 | Gill et al. ....................... 700/17 |
| 5,497,289 | A | * | 3/1996 | Sugishima et al. .......... 361/709 |
| 5,949,640 | A | * | 9/1999 | Cameron et al. ............ 361/600 |
| 6,445,585 | B1 | | 9/2002 | Walker |
| 6,778,381 | B1 | | 8/2004 | Bolognia et al. |
| 7,082,028 | B2 | * | 7/2006 | Huilgol et al. ......... 361/679.07 |
| 7,280,346 | B2 | * | 10/2007 | Lewis et al. ............ 361/679.01 |
| 7,474,229 | B2 | * | 1/2009 | Franz et al. ............... 340/815.4 |
| 2005/0035262 | A1 | * | 2/2005 | Seki et al. ................. 248/441.1 |
| 2007/0086154 | A1 | * | 4/2007 | Koch ........................... 361/681 |
| 2008/0302643 | A1 | * | 12/2008 | Victor et al. ................. 200/331 |

FOREIGN PATENT DOCUMENTS

| EP | 0854565 | A | 7/1998 |
| EP | 1303173 | A | 4/2003 |
| FR | 2823058 | A | 10/2002 |

\* cited by examiner

*Primary Examiner*—Jayprakash N Gandhi
*Assistant Examiner*—Ingrid Wright
(74) *Attorney, Agent, or Firm*—Thomas R. Vigil

(57) ABSTRACT

The invention is directed to an inverter including a casing (1) with at least two chambers (2, 3), the one chamber (3) comprising the display (11) of a communication unit, said display (11) being pivotally disposed in the chamber (3).

5 Claims, 4 Drawing Sheets

INVERTER COMPRISING A CASING

CROSS REFERENCE TO RELATED APPLICATIONS

This application claims Priority from European Application No. EP 07011248.7 filed Jun. 8, 2007

FIELD OF INVENTION

The present invention relates to an inverter comprising a casing.

DESCRIPTION OF THE PRIOR ART

A rectifier with a casing is known from FR 2823058; it exhibits a keyboard on a caption area. Moreover, plug connectors are provided on the outer side of the rectifier's casing, which permit to conclude that this rectifier is intended for outside use.

EP 0 854 565 A2 shows an inverter casing, the electronic power components being housed in a chamber of said casing. In the casing, this chamber is adjoined with a second chamber comprising a fan that cools cooling ribs disposed in said second chamber. Between the two chambers there is a passageway for also conveying cooling air into the chamber housing the electronic power components. Accordingly, if this casing were to be used outside, humidity could penetrate into the chamber with the electronic power components.

U.S. Pat. No. 6,778,381 B1 shows a casing with retractable processor modules, which may be individually pulled out, a display being tiltable downward in the pulled out condition.

In the exploitation of alternative energy sources such as PV modules, inverters serve to convert direct current into alternating current. Such an inverter comprises a casing accommodating electronic power components. These electronic power components must be protected against environmental impact, in particular against humidity. Such an inverter includes not only electronic power components but also and in particular a plurality of plugs for AC and DC connection of the inverter. Furthermore, such an inverter also has a communication unit with a display that must also be connected. Such a display is visible in the casing from the outside through a corresponding opening in the cover. Furthermore, there are provided optionally retrofittable communication interfaces that may be connected through cable feedthroughs in the wall to the other chamber.

As already explained above, such an inverter casing accommodates both electronic power components and other electric components such as plugs or also a communication unit with a display. The electronic power components are subjected to a higher IP-rating than the other electric components. Insofar, these components may be housed in a separate chamber having a special rating, namely the rating IP65 in particular. This means that the other components are disposed in the other chamber. More specifically, there are provided a plurality of plug connections since the inverter must be both AC and DC connected to the PV module or rather to the grid. The plugs are usually disposed in the region of the wall between the two chambers. As already explained, the display of the communication unit is located in the one chamber which usually does not accommodate the electronic power components. Such a display with a communication unit has a certain size that occupies by itself a considerable space in the chamber which accommodates in particular the plug connectors for AC and DC connection.

BRIEF SUMMARY OF THE DESCRIPTION

The object underlying the invention consists in not having to compensate the space required by the communication unit with the display by a corresponding larger casing for the inverter.

To achieve this object, the invention proposes to pivotally dispose the display in the chamber, components being located underneath the display which may be accessed once the display is pivoted. This means that, when the cover is removed, the display is pivotal outward, i.e., toward the removed cover. In the outward pivoted position, the space underneath the communication unit with the display is immediately accessible. In particular when the distance between the communication unit with the display and the bottom of the casing or of the chamber accommodating the communication unit with the display does not fall below a certain height, there is the possibility to accommodate beneath the display plug connections or other components, in particular communication interfaces that become indeed accessible by pivoting the display. This means that in principle the space underneath the display is accessible without having to remove the display. Such a pivoting mechanism for the display of the communication unit or for the communication unit as such makes it possible to fully make use of the space provided in the inverter casing, in particular in the wall region of the transition between two casing chambers, for accommodating there at need, underneath the communication unit with the display, additional electric components, more particularly plugs for AC and DC connection of the inverter to the electronic power components. In particular the fact of disposing the communication unit in the casing chamber that does not house the electronic power components makes it in principle possible to access the chamber at no risk for mounting purposes.

Advantageous features of the invention will become apparent from the dependent claims.

There is more specifically provided that the at least two chambers of the inverter casing may be covered by at least two separate covers. It is obvious therefrom that, irrespective of the access to the power electronics located in a chamber of the inverter casing consisting of at least two chambers and covered by a separate cover, there is the possibility of quite safe access for the purpose of mounting or dismounting the electric components, the plugs or the communication unit.

For the display to be pivotal, the chamber comprises in particular means for pivotally receiving the display and the communication unit respectively. More specifically, there is provided in this context that the means is at least one pin that engages into a corresponding recess of the display or of the communication unit. Of course, it may also be envisaged that the pin be disposed on the display and the pin receiving recess on the chamber. This means that the connection between the communication unit and the chamber resembles a hinge.

If the display of a communication unit does not extend from the one end of the chamber to the other end of the chamber, it is possible to dispose the one pin on the wall of the chamber and the other pin on the opposite side on a support disposed on the bottom of the casing chamber.

According to another feature of the invention, there is provided that the display may be fixed in the outward pivoted condition. Inverter casings are often mounted vertically. If the display is now tilted upward, there is the risk that the display of the communication unit tilts downward when the inverter is mounted to a wall. Naturally, this is not desirable if mounting is performed in the space underneath the display.

Accordingly, there is provided, according to the invention, that the display may be fixed in the outward pivoted condition. On the wall of the chamber and/or on the support, there is provided a clamping device that clampingly takes hold of another pin disposed on the display. The clamping device more specifically includes a flexible arm with a projection disposed at its end for taking hold of the pin or of the other pins.

The invention will be discussed in closer detail herein after with reference to the drawings.

DETAILED DESCRIPTION OF THE INVENTION

Figure 1:
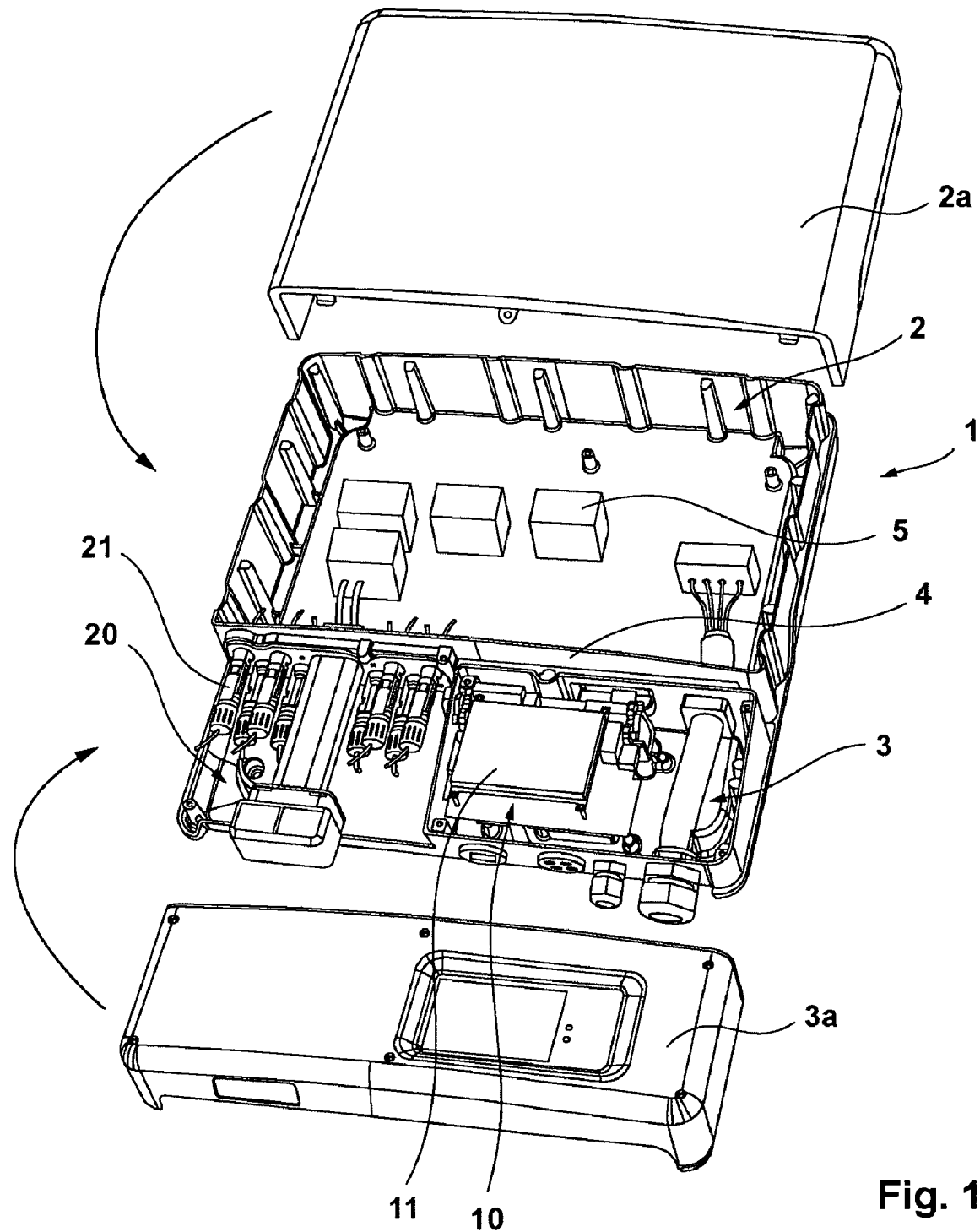
FIG. 1 shows the casing of an inverter with a communication unit with a display in the non-pivoted state.

The casing 1 of the inverter includes the two chambers 2 and 3 that are separated from each other by a wall 4; the two chambers 2, 3 may be closed by separate covers 2a, 3a. The chamber 2 comprises the electronic power components 5, which are only schematically outlined. In the chamber 3 by contrast there are located the communication unit 10 with the display 11. Next to the chamber 3, there is provided a casing portion 20 serving to receive plug elements 21 for the DC connection with the PV modules.

Figure 2:
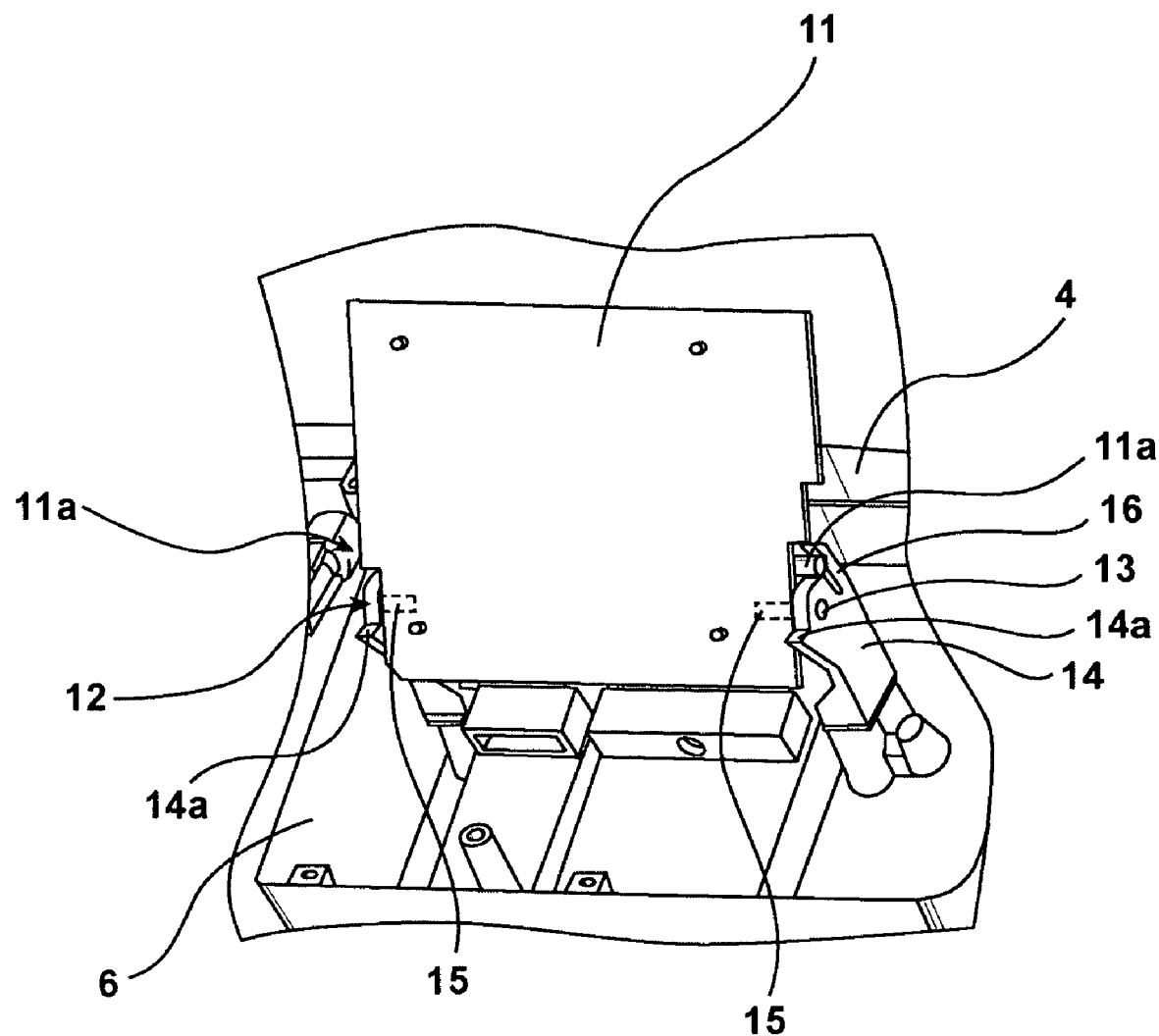
FIG. 2 shows the view of FIG. 1 in cross-section with the display being pivoted.
Figure 3:
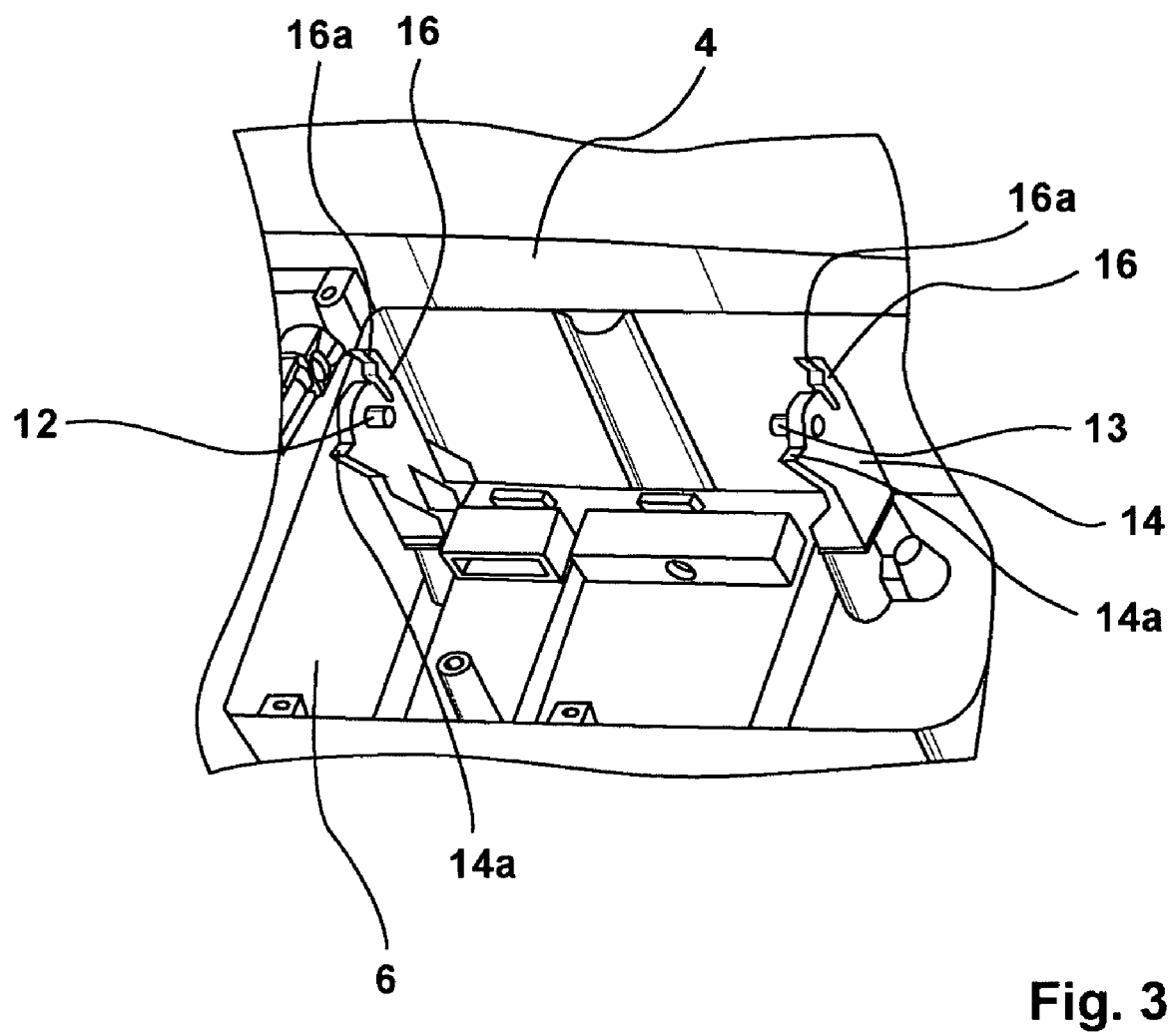
FIG. 3 shows a view like FIG. 2, only the pivoting mechanism for the display being visible in the one casing chamber.
Figure 4:
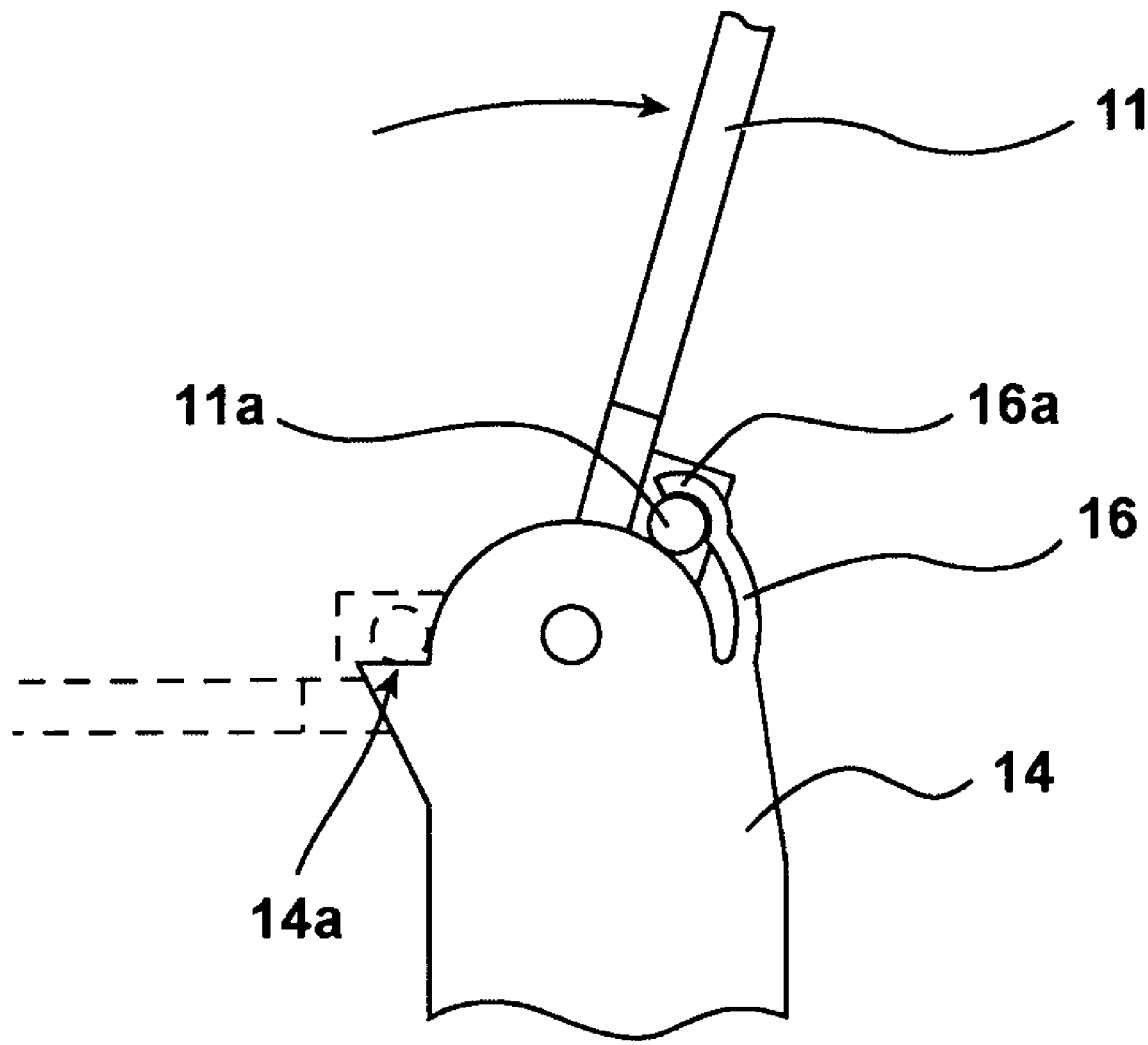
FIG. 4 shows the clamping device for the display.

The invention is directed to how to dispose the communication unit 10 with the display 11 in the casing chamber 3. Reviewing FIG. 2 in this context, it appears that the display 11 is in its pivoted position. For pivotally accommodating the display 11 as it appears in particular in FIG. 2 and in FIG. 3, a pin 12, 13 is provided on either side of the display or rather of the communication unit, the pin 12 being disposed on the wall 6 of the casing chamber 3, whereas a support 14 is provided for receiving the pin 13. The display itself comprises a recess 15 for receiving a respective one of the pins 12, 13 so that the pins 12, 13 receive the display or the communication unit in the fashion of a hinge.

On either side, the display comprises an additional pin 11a; a flexible arm 16 is respectively provided both on the wall 6 and on the support 14, said arm comprising at its end a projection 16a for clampingly receiving the respective additional pin 11a when the display is tilted upward. If the display is tilted downward, the additional pin rests on a table-like projection 14a, 12a. Underneath the display there are plugs or other components that are accessible when the display is tilted upward.

We claim:

1. An inverter, comprising a casing with at least two chambers, the one chamber comprising a display of a communication unit, the display being pivotally disposed in the chamber, components being located underneath the display and being accessible once the display is pivoted and wherein the chamber comprises at least one pin for pivotally receiving the display, and a clamping device is provided in a region of the pin on a wall of the chamber, and/or on a support of the display, the clamping device taking clampingly hold of another pin disposed on the display when the display is in an upward tilted position.

2. The inverter as set forth in claim 1, wherein the display is adapted to be fixed in an upward tilted position.

3. The inverter as set forth in claim 1, wherein the display is pivotally disposed in the chamber, at a distance from a bottom of the chamber.

4. The inverter as set forth in claim 1, wherein the at least two chambers of the casing of the inverter may be covered by at least two covers.

5. The inverter as set forth in claim 1, wherein the display is arranged to be pivotable once a cover of the chamber is removed.

* * * * *